(12) United States Patent
Bates et al.

(10) Patent No.: US 11,372,714 B2
(45) Date of Patent: Jun. 28, 2022

(54) SYSTEM AND METHOD FOR PERFORMING ERASURE CODING IN A DISTRIBUTED STORAGE SYSTEM

(71) Applicant: EIDETIC COMMUNICATIONS INC., Calgary (CA)

(72) Inventors: Stephen Bates, Canmore (CA); Saeed Fouladi Fard, Calgary (CA)

(73) Assignee: EIDETIC COMMUNICATIONS INC., Calgary (CA)

( * ) Notice: Subject to any disclaimer, the term of this patent is extended or adjusted under 35 U.S.C. 154(b) by 121 days.

(21) Appl. No.: 16/803,225

(22) Filed: Feb. 27, 2020

(65) Prior Publication Data
US 2021/0271547 A1 Sep. 2, 2021

(51) Int. Cl.
| G06F 11/10 | (2006.01) |
| G06F 11/07 | (2006.01) |
| G06F 11/30 | (2006.01) |
| G06F 9/54 | (2006.01) |
| G11C 16/14 | (2006.01) |

(Continued)

(52) U.S. Cl.
CPC .......... *G06F 11/1032* (2013.01); *G06F 9/544* (2013.01); *G06F 11/0757* (2013.01); *G06F 11/3034* (2013.01); *G06F 13/1673* (2013.01); *G11C 16/14* (2013.01); *G11C 16/26* (2013.01); *G06F 2213/0026* (2013.01)

(58) Field of Classification Search
CPC .. G06F 11/1032; G06F 13/1673; G06F 9/544; G06F 11/0757; G06F 11/3034; G06F 2213/0026; G11C 16/14; G11C 16/26

USPC .......................................................... 714/800
See application file for complete search history.

(56) References Cited

U.S. PATENT DOCUMENTS

| 7,032,166 B2 * | 4/2006 | Servi ...................... H03M 13/03 714/800 |
| 9,026,867 B1 * | 5/2015 | Northcott ............... G11C 29/00 714/704 |
| 9,575,689 B2 | 2/2017 | Savic et al. |

(Continued)

OTHER PUBLICATIONS

AMD DatsaCenter Solutions Solution Brief "Accelerating NVM Express Storage with Eideticom's NoLoad, AMD EPYC CPUs, and p2pdma".

(Continued)

*Primary Examiner* — James C Kerveros
(74) *Attorney, Agent, or Firm* — Borden Ladner Gervais LLP; Todd Keeler

(57) ABSTRACT

A method and a hardware accelerator device are provided for performing erasure coding on the hardware accelerator device that includes a dedicated buffer memory that is resident on the hardware accelerator device and that is connected to a second device via a bus, the method includes receiving, at the dedicated buffer memory, write data directly from the second device via the bus such that receiving the data at the dedicated buffer memory bypasses a buffer memory connected to a central processing unit (CPU), performing, at the hardware accelerator, an erasure coding operation on the write data received at the dedicated buffer memory to generate parity data based on the received write data, transmitting the parity data directly to a storage device connected to the hardware accelerator device via the bus such that transmitting the parity data bypasses the buffer memory connected to the CPU.

10 Claims, 4 Drawing Sheets

(51) Int. Cl.
 *G11C 16/26* (2006.01)
 *G06F 13/16* (2006.01)

(56) References Cited

U.S. PATENT DOCUMENTS 10,838,885 B2 * 11/2020 Olarig ................. H03M 13/154
2021/0181995 A1 * 6/2021 Ki ....................... G06F 13/4295

OTHER PUBLICATIONS

Bittware., "FPGA-Accelerated NVMe Storage Solutions," Using the Bittware 250 Series Accelerators, found at https://www.bittware.com/resources/nvme-storage/.

* cited by examiner

SYSTEM AND METHOD FOR PERFORMING ERASURE CODING IN A DISTRIBUTED STORAGE SYSTEM

FIELD

The present disclosure relates to performing erasure coding in a distributed storage system.

BACKGROUND

Erasure Coding (EC) is a method for protecting data in a distributed storage system. EC has some similarities with redundant array of independent disks storage systems (RAID) but the major difference is that RAID is performed inside a single server to protect a drive in that server whereas EC is used to protect data on drives spread across a data-center, or multiple data-centers.

EC typically comprises parsing data into portions, expanding the data and encoding the data with redundant bits, and storing the data in different storage locations such that if data becomes corrupted during storage, the data may be recovered utilizing data stored at other locations in the distributed storage system.

Improvements to performing EC in distributed storage systems are desired.

BRIEF DESCRIPTION OF THE DRAWINGS

Embodiments of the present disclosure will now be described, by way of example only, with reference to the attached Figures.

DETAILED DESCRIPTION

Figure 1:
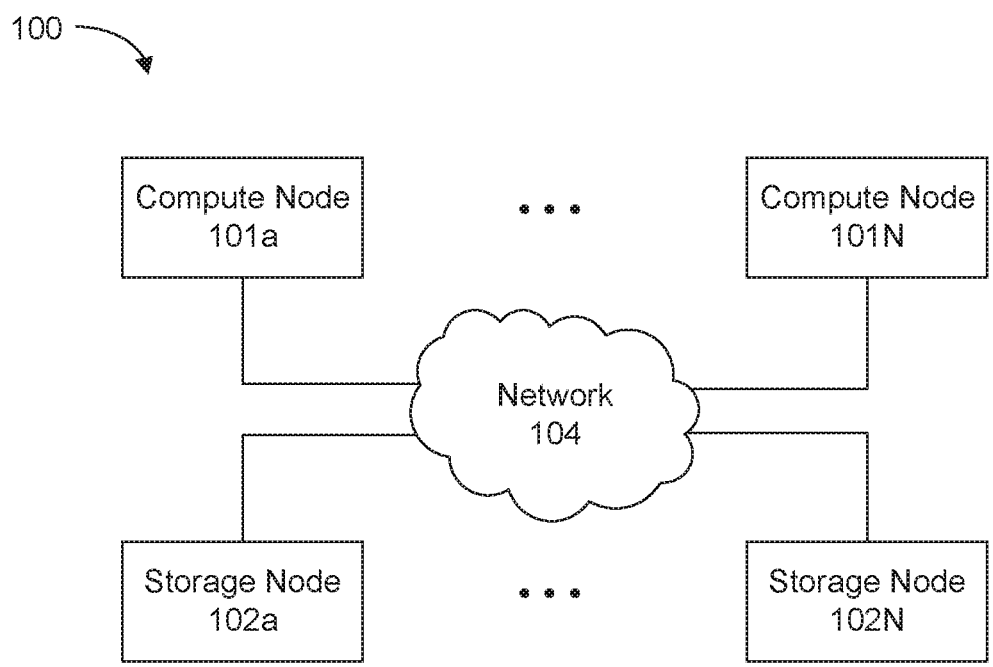
FIG. 1 is a schematic diagram of an example distributed storage system.

The present disclosure provides systems and methods for performing erasure coding (EC) in a distributed storage system.

Embodiments of the present disclosure relate to utilizing a hardware accelerator in a storage node to perform an EC operation on write data to generate parity data, and transmitting the parity data for storage utilizing a direct transfer that bypasses a central processing unit (CPU) of the storage node. The direct transfer may be, for example, peer-to-peer direct memory access (p2pDMA).

In an embodiment, the present disclosure provides a method for performing erasure coding on a hardware accelerator device that includes a dedicated buffer memory that is resident on the hardware accelerator device and that is connected to a second device via a bus, the method includes receiving, at the dedicated buffer memory, write data directly from the second device via the bus such that receiving the data at the dedicated buffer memory bypasses a buffer memory connected to a central processing unit (CPU), performing, at the hardware accelerator, an erasure coding operation on the write data received at the dedicated buffer memory to generate parity data based on the received write data, transmitting the parity data directly to a storage device connected to the hardware accelerator device via the bus such that transmitting the parity data bypasses the buffer memory connected to the CPU.

In an embodiment, transmitting the parity data is performed in response to a trigger.

In an embodiment, the trigger comprises one or more of receiving, at the dedicated buffer memory, a predetermined amount of write data, generating, at the hardware accelerator, a predetermined amount of parity data since the parity data was last transmitted, determining that a predetermined amount of time has elapsed since parity data was last transmitted.

In an embodiment, the dedicated memory buffer resident on the hardware accelerator device is connected to the second device via a network interface card (NIC), and wherein receiving write data directly from the second device comprises receiving the write data over a network via the NIC.

In an embodiment, the hardware accelerator device is connected to the storage device via a network interface card (NIC) such that transmitting the parity data directly to the storage device comprises transmitting the parity data over a network via the NIC.

In an embodiment, the bus is a peripheral component interconnect express (PCIe) bus.

In another embodiment, the present disclosure provides hardware accelerator device that is connectable to a second device and a storage node via a bus, the hardware accelerator device including a dedicated buffer memory configured to receive write data directly from the second device such that the data received at the dedicated buffer memory bypasses a buffer memory connected to a central processing unit (CPU) of the hardware accelerator device, a hardware accelerator connected to the dedicated buffer memory, the hardware accelerator configured to perform an erasure coding operation on write data to generate parity data based on the received write data, wherein the write data that is received directly from the second device such that the data received at the dedicated buffer memory bypasses a buffer memory connected to a central processing unit (CPU) of the hardware accelerator device, transmit the parity data directly to the storage device such that transmission of the parity data bypasses the buffer memory connected to the CPU.

In an embodiment, the hardware accelerator is configured to transmit the parity data is performed in response to a trigger.

In an embodiment, the trigger comprises one or more of a predetermined amount of write data being received at the dedicated buffer memory from the second device, a predetermined amount of parity data being generated since a parity data was last transmitted, a predetermined amount of time having elapsed since parity data was last transmitted.

In an embodiment, the dedicated memory buffer is connected to the second device via a network interface card (NIC), and the dedicated memory buffer being configured to receive write data directly from the second device comprises the dedicated memory buffer being configured to receive the write data over a network via the NIC.

In an embodiment, the hardware accelerator is connected to the storage device via a network interface card (NIC) such that the hardware accelerator being configured to transmit the parity data directly to the storage device comprises the hardware accelerator being configured to transmit the parity data over a network via the NIC In an embodiment, wherein the bus is a peripheral component interconnect express (PCIe) bus.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

Referring to FIG. 1, an example of a distributed storage system 100 is shown. The distributed storage system 100 includes one or more compute nodes 101a-101N and one or more storage nodes 102a-102N that communication via a network 104. The network 104 may be any suitable wired or wireless network, or combination of wired and wireless networks including, for example, a local area network (LAN), or a wide area network (WAN), or a combination thereof.

In general, compute nodes 101a-101N initiate storage related requests to the storage back-end, including for example read requests, write requests, and flush requests. Storage nodes 102a-102N perform storage related functions including, for example, receive storage related requests from the compute nodes 101a-101N, store data received from compute nodes 101a-101N, retrieve stored data in response to read requests received from compute nodes 101a-101N, and protect data utilizing schemes that include EC.

Figure 2:
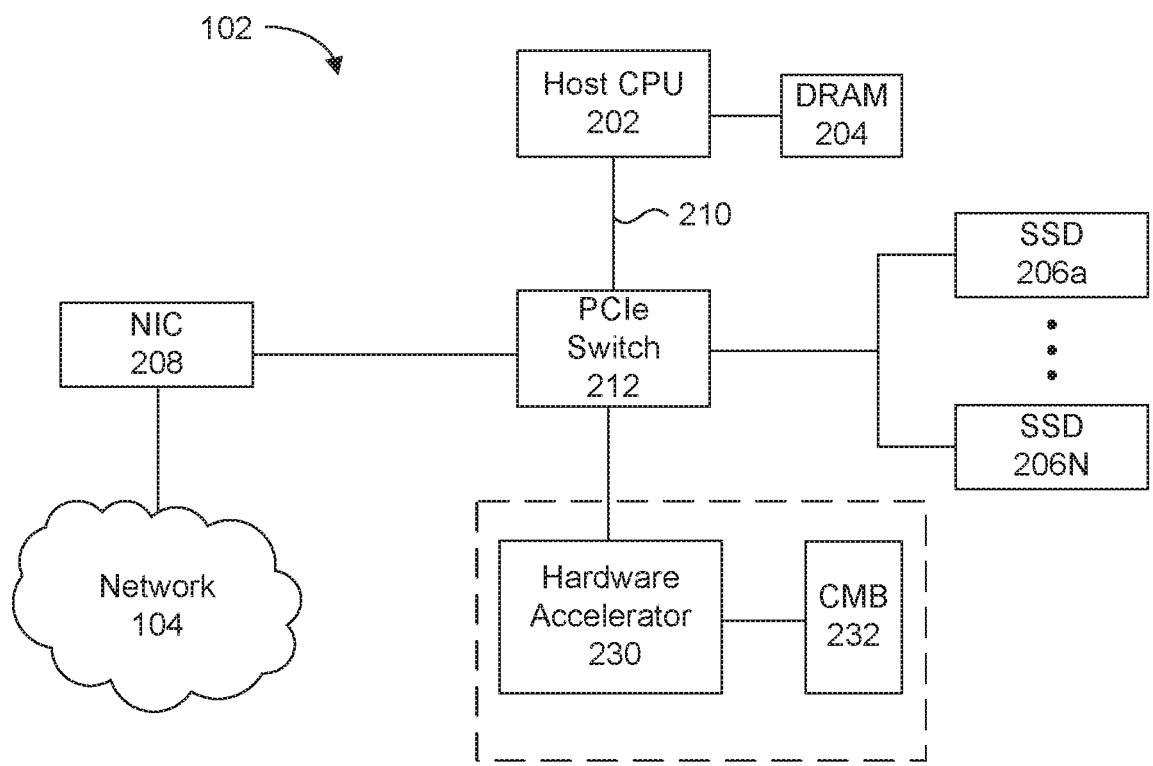
FIG. 2 is a schematic diagram of an example storage node of the example distributed storage system of FIG. 1 in accordance with the present disclosure.

Referring to FIG. 2, an example of a storage node 102 in accordance with the present disclosure is shown. The storage node 102 includes a host CPU 202, a dynamic random access memory (DRAM) 204 associated with the host CPU 202, one or more solid state drives (SSD) 206a-2016N, a network interface card (NIC) 208, and a hardware accelerator device 230 connected to the host CPU 202. The hardware accelerator device 230 may have an associated Control Memory Buffer (CMB) 232.

In the example storage node 102 shown in FIG. 2, the host CPU 202 is optionally connected to the one or more solid state drives (SSD) 206a-2016N, the network interface card (NIC) 208, and the hardware accelerator device 230 via a PCIe bus 210 and a PCIe switch 212. However, in other embodiments (not shown), the CPU 202, the one or more solid state drives (SSD) 206a-2016N, the network interface card (NIC) 208, and the hardware accelerator device 230 may be connected via any suitable bus operating on any suitable protocol.

The NIC 208 enables the storage node 102 to communicate with remote devices, such as the compute nodes 101a-101N and other storage nodes 102a-102N shown in FIG. 1, over the network 104.

Figure 3:
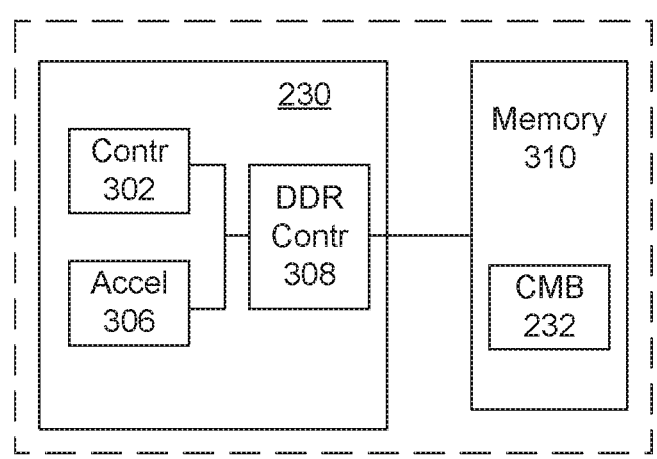
FIG. 3 is a schematic diagram of an acceleration device in accordance with the present disclosure.

FIG. 3 shows schematic diagram of an example of the components of the accelerator device 230. In the example shown, the accelerator device 230 includes a controller 302, which includes a DMA engine, one or more hardware accelerators 304, and a DDR controller 308. The CMB 232 associated with the accelerator device 230 may be included within a memory 310 associated with the accelerator device 230.

Referring back to FIGS. 1 and 2, the operation of a storage node 102 of the distributed storage system 100 will be described.

In some embodiments, the write data is received at the NIC 208 of a storage node 102 via the network 104 from a compute node 101. The write data is sent to the CPU 202 and stored to the DRAM 204 associate with the CPU 202. The CPU 202 then sends a command to the hardware accelerator 230 to perform an EC operation on the write data. The command from the CPU may include the write data, or may include a pointer to the storage location of the write data on the DRAM. The hardware accelerator 230 then performs the EC operation on the write data to generate parity data, then sends the generated parity data back to the CPU 202, The CPU 202 then stores the generated parity data on the DRAM 204, then transmits the generated parity data to one or more of the SSDs 206a-206N of the storage node 102, or to one or more of the SSDs of a remote storage node, such as one of the other storage nodes 102a-102N shown in FIG. 1, or to both local SSDs 206a-206N and to SSDs of remote storage nodes, for long term storage.

In the above described operation, the processes of the storage node 102 are coordinated by the host CPU 202, and includes multiple transmissions of data from the CPU to hardware accelerator 230, back to the CPU 202, then to the SSDs 206a-206N. This places computational load on the CPU 202 of the storage node 102 and tends to increase the total amount of network traffic and the total amount of data to be stored.

The present disclosure provides an alternative embodiment a method for generating the EC protection that is desired with less data movement and utilizing less CPU 202 resources compared with the previously described embodiment. In the alternative embodiment of the present disclosure, write data received at the NIC 208 via the network 104 from a remote compute node 101 is sent directly to the CMB 232 of the hardware accelerator 230, bypassing the CPU 202. Further, parity data generated at the hardware accelerator 230 is transmitted directly to the one or more of the SSDs 206a-206N for storage, or to the NIC 208 for remote storage on a remote SSD, or to both the local SSDs 206a-206N and the NIC 208 for remote storage, bypassing the CPU 202.

By bypassing the CPU 202 to send write data to the hardware accelerator 230 and to transmit generated parity data out of the hardware accelerator for storage, traffic is reduced on the bus 210 by reducing the number of times the write data is moved through the storage node 102, and computation resources of the CPU 202 is reduced by avoiding having the CPU 202 coordinate the EC operation.

Figure 4:
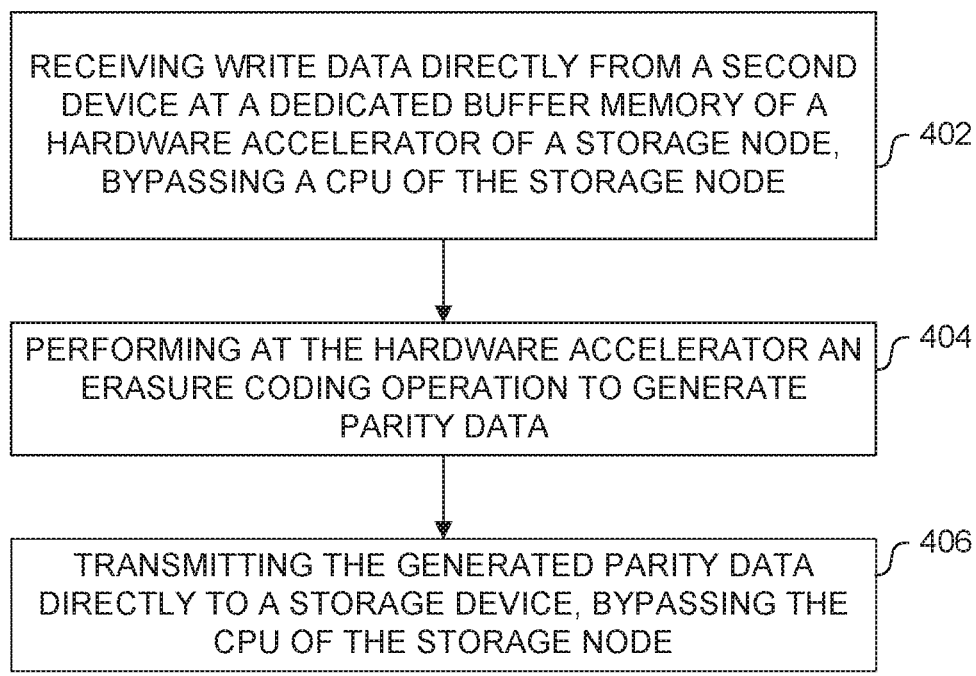
FIG. 4 is a flow chart illustrating a method for performing erasure coding in a distributed storage system in accordance with the present disclosure.

Referring now to FIG. 4, flow chart illustrating a method of performing an EC on a hardware accelerator device of a storage node, such as the example hard accelerator 230 on the storage node 102, such that data transfers in the storage node bypass the CPU of the storage node. The method may be performed by, for example, a processor of a hardware accelerator that performs instructions stored in a memory of the hardware accelerator.

At 402, write data is received directly from a second device at a dedicated buffer memory of a hardware accelerator of a storage node, bypassing the CPU of the storage node. The storage node may be for example, the storage node 102 described previously with reference to FIG. 2, and the dedicated buffer memory may be the CMB 232 associated with the hardware accelerator 230. The second device may be, for example, one of the compute node 101a-101N described with reference to FIG. 1.

Receiving write at the dedicated buffer memory may comprise the second device writing the data directly to the dedicated buffer memory, or may comprise the data being received at the hardware accelerator associated with the dedicated buffer memory and the hardware accelerator writing the write data to the dedicated buffer memory.

The second device may be a remote device that is connected to the dedicated buffer memory via a NIC and a network, such as for example the NIC 208 and network 104 described previously. Receiving the write data may comprise receiving data utilizing, for example, p2pDMA in which the second device, or the NIC if the second device is a remote device, writes data directly to the dedicated buffer memory such that the CPU is bypassed.

At 404, the hardware accelerator performs an EC operation on the write data received at the dedicated buffer memory to generate parity data. The EC operation that is performed may be any suitable operation for performing erasure coding. The hardware accelerator may store the generated parity data in the dedicated buffer memory.

At 406, the generated parity data is transmitted by the hardware accelerator directly to a storage device such that the transmitted parity data bypasses the CPU of the storage node. The storage device may be one or more of the storage devices of the storage node on which the hardware accelerator 230 is located such as, for example, one or more of the SSDs 206a-206N of the example storage node 102 described with reference to FIG. 2. Alternatively, or additionally, the storage device may be storage devices that the parity data is transmitted to may be remote storage devices on one or more remote storage nodes that the hardware accelerator may communicate with via a NIC and a network, such as the MC 208 and network 104 described previously with reference to FIG. 2.

Transmitting the parity data may comprise sending the parity data to the storage device, or may comprising sending a pointer to the storage device with a command for the storage device to read the data from the dedicated buffer memory. The storage device may read the generated storage data from the dedicated buffer memory such that the generated parity data bypasses the CPU of the storage node.

Transmitting the generated parity data from the hardware accelerator directly to the storage device, or the storage device reading the generating parity data from the dedicated buffer memory, may be performed utilizing, for example, p2pDMA. In the example in which one or more of the storage devices are remote storage devices, the hardware accelerator may transmit the parity data to a MC on the storage node that includes the hardware accelerator utilizing p2pDMA.

Transmitting the parity data at 406 may also comprise transmitting the write data received from the storage device to the storage node, or storage nodes. The write data may be transmitted to the same storage node(s) as the parity data is transmitted to, or may be transmitted to one or more storage nodes that differ from the storage node(s) that the parity data is transmitted to, or may be transmitted to both the same storage node(s) as the parity data as well as one or more different storage nodes.

The transmission of generated parity data at 406 may be performed in response to a triggering event. In this example, generated parity data may be stored, or accumulated, in the dedicated buffer memory of the hardware accelerator until a triggering event occurs. When the triggering event occurs, the accumulated parity data is then transmitted, or "flushed", out to one or more storage devices as described previously. The triggering event may be one or more of, for example, generating a predetermined amount of parity data, after a predetermined amount of time has elapsed, or after a certain amount of input data has been processed. In an example, the parity data may be flushed when one or more of 10 MB of parity data has been generated since a previous flush, 60 seconds has elapsed since a previous flush, or 100 MB of input data has been processed since a previous flush.

The present disclosure provides a storage node and method in which EC operations are performed on hardware accelerator, rather than a CPU of the storage node. Write data received from a compute node is received at the hardware accelerator which performs the EC operation to generate parity data and transmit the parity data to storage devices, either locally on the storage node or on remote storage nodes.

Offloading performing the EC operation and transmitting the generated parity data to a storage device to the hardware accelerator reduces the computation load that is placed on the CPU of the storage node compared to convention storage nodes in which EC operations are performed by the CPU.

The present disclosure also provides a hardware accelerator device and method in which write data from the compute node is received directly at a dedicated buffer memory of the hardware accelerator, rather than at a CPU which would then transmit the write data to the hardware accelerator. Further, the hardware accelerator transmits of the generated parity data, and in some examples, the write data, to one or more storage devices directly, rather than passing this data to the CPU for transmission to the one or more storage devices. This direct movement of data may be performed utilizing, for example, p2pDMA.

By utilizing direct movement of data of, for example, write data from a NIC to the dedicated buffer of the hardware accelerator, and the generated parity data to a local storage device on the storage node, or to the NIC for transmission to a remote storage device, such that the CPU is bypassed further reduces the computation load placed on the CPU and reduces the amount of traffic on the bus of the storage node compared to conventional storage node in which all data movement passes through the CPU.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method for performing erasure coding on a hardware accelerator device that includes a dedicated buffer memory and is associated with a central processing unit (CPU), the dedicated buffer memory is resident on the hardware accelerator device, and the hardware accelerator device is connected to a second device via a bus, the method comprising:
receiving, at the dedicated buffer memory, write data directly from the second device via the bus such that receiving the data at the dedicated buffer memory does not include receiving the data at a buffer memory connected to the CPU;
performing, at the hardware accelerator, an erasure coding operation on the write data received at the dedicated buffer memory to generate parity data based on the received write data;
transmitting the parity data directly to a storage device connected to the hardware accelerator device via the bus such that transmitting the parity data does not include transmitting the parity data to the buffer memory connected to the CPU;
wherein the second device is remote to the hardware accelerator device and the CPU, and is connected to the hardware accelerator device over a network via a network interface card (NIC) and wherein receiving write data directly from the second device comprises receiving the write data over a network via the NIC.

2. The method of claim 1, wherein transmitting the parity data is performed in response to a trigger.

3. The method of claim 2, wherein the trigger comprises one or more of receiving, at the dedicated buffer memory, a predetermined amount of write data, generating, at the hardware accelerator, a predetermined amount of parity data since the parity data was last transmitted, determining that a predetermined amount of time has elapsed since parity data was last transmitted.

4. The method of claim 1, wherein the hardware accelerator device is connected to the second device via a network interface card (NIC), and wherein receiving write data directly from the second device comprises receiving the write data over a network via the NIC.

5. The method of claim 1, wherein the bus is a peripheral component interconnect express (PCIe) bus.

6. A hardware accelerator device that is associated with a central processing unit (CPU) and is connectable to a second device and a storage node via a bus, the hardware accelerator device comprising:
a dedicated buffer memory configured to receive write data directly from the second device such that the data received at the dedicated buffer memory is not received at a buffer memory connected to the CPU associated with the hardware accelerator device;
a hardware accelerator connected to the dedicated buffer memory, the hardware accelerator configured to:
perform an erasure coding operation on write data to generate parity data based on the received write data, wherein the write data that is received directly from the second device;
transmit the parity data directly to the storage device such that transmission of the parity data does not include transmission of the parity data to the buffer memory connected to the CPU;
wherein the second device is remote to the hardware accelerator device and the CPU, and is connectable to the hardware accelerator device over a network via a network interface card (NIC) and the dedicated memory buffer being configured to receive write data directly from the second device comprises the dedicated memory buffer being configured to receive the write data over a network via the NIC.

7. The hardware accelerator device of claim 6, wherein the hardware accelerator is configured to transmit the parity data is performed in response to a trigger.

8. The hardware accelerator device of claim 7, wherein the trigger comprises one or more of a predetermined amount of write data being received at the dedicated buffer memory from the second device, a predetermined amount of parity data being generated since a parity data was last transmitted, a predetermined amount of time having elapsed since parity data was last transmitted.

9. The hardware accelerator device of claim 6, wherein the hardware accelerator is connected to the storage device via a network interface card (NIC) such that the hardware accelerator being configured to transmit the parity data directly to the storage device comprises the hardware accelerator being configured to transmit the parity data over a network via the NIC.

10. The hardware accelerator device of claim 6, wherein the bus is a peripheral component interconnect express (PCIe) bus.

* * * * *